(12) United States Patent  
Lin et al.

(10) Patent No.: US 7,994,531 B2
(45) Date of Patent: Aug. 9, 2011

(54) WHITE-LIGHT LIGHT EMITTING DIODE CHIPS AND FABRICATION METHODS THEREOF

(75) Inventors: Chun-Chi Lin, Hsinchu (TW); Tzu-Han Lin, Hsinchu (TW); Wei-Hung Kang, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 174 days.

(21) Appl. No.: 12/417,412

(22) Filed: Apr. 2, 2009

(65) Prior Publication Data  
US 2010/0252845 A1 Oct. 7, 2010

(51) Int. Cl.  
*H01L 33/00* (2010.01)

(52) U.S. Cl. ........... 257/98; 257/79; 257/80; 257/88; 257/100; 257/103; 438/22; 438/25; 438/26; 438/47

(58) Field of Classification Search .......... None  
See application file for complete search history.

(56) References Cited

U.S. PATENT DOCUMENTS

2004/0207323 A1 * 10/2004 Erchak et al. .......... 313/581

* cited by examiner

*Primary Examiner* — N Drew Richards  
*Assistant Examiner* — Kyoung Lee  
(74) *Attorney, Agent, or Firm* — Muncy, Geissler, Olds & Lowe, PLLC

(57) ABSTRACT

A white-light LED chip and a fabrication method thereof are provided. The white-light LED chip comprises a blue-light LED chip and a phosphor layer directly disposed on a top surface of the blue-light LED chip. The method comprises providing a plurality of blue-light LED chips attached to a substrate, wherein at least one contact pad is formed on the top surface of each blue-light LED chip. A protective layer is formed on the contact pad. A phosphor layer is formed on the top surface of the blue-light LED chip by a molding process, exposing the contact pad. Finally, the protective layer and the substrate are removed from the blue-light LED chip to form a white-light LED chip.

17 Claims, 5 Drawing Sheets

WHITE-LIGHT LIGHT EMITTING DIODE CHIPS AND FABRICATION METHODS THEREOF

BACKGROUND OF THE INVENTION

1. Field of the Invention

The invention relates to a light-emitting diode (LED) chip and more particularly to a white-light LED chip and a fabrication method thereof.

2. Description of the Related Art

Light-emitting diode (LED) is a compound semiconductor device that energy transfers electrical current into light. The light emitted by an LED is distributed across a spectrum that is approximately 20~40 nm wide and has a peak emission wavelength defined by the semiconductor material of a light-emitting layer of the LED. As a consequence of the peak emission wavelength, a single LED cannot emit white light, which is composed of spectral contributions from almost the entire wavelength range of the visible spectrum. FIG. 1 shows a cross section of a conventional white light emitting device 100. The white light emitting device 100 includes a blue-light LED chip 12 disposed in a reflective cup 10 and surrounded by phosphors 14. A glass plate 16 is disposed on the reflective cup 10, covering the LED chip 12 and the phosphors 14. In the exemplary device of FIG. 1, a portion of the blue light emitted by the LED chip 12, and the red and the green light emitted by the phosphor 14 as a result of a partial absorption of the blue light can combined to produce white light.

However, white light generated by sources such as the device illustrated in FIG. 1 is not uniform in color. This non-uniformity is a consequence of the variations in the thickness of the phosphors 14 surrounding the LED chip 12. The variations in the thickness cause spatially non-uniform absorption of blue light and emission of red and green light. Therefore, the generated white light is surrounded by colored rings.

U.S. Pat. No. 6,576,488 discloses a method for conformally coating a light emitting semiconductor structure, such as an LED chip, with a phosphor layer. The method involves electrically coupling an LED chip to a submount, applying a first bias voltage to the submount, and applying a second bias voltage to a solution of charged (pumped) phosphor particles. The electric field created by the two bias voltages induces the phosphor particles to deposit on the conductive surface, such as the surfaces of the submount and the LED chip. However, using the electrophoretic deposition process to form a phosphor layer on a LED chip has some problems. The adhesion between the phosphor particles and the surface of the LED chip is weak, such that the phosphor layer is easily separated from the LED chip. U.S. Pat. No. 6,576,488 discloses using a chemical vapor deposition (CVD) process to form a tinted thin film of a yellow color material on a blue LED element. This method can improve light uniformity and the light output is not heavily dependent on the thickness of a substrate of an LED chip. However, the process of this method is complicated, as passivation layers that cover the LED chip need to be formed. Additionally, it is difficult to control the process for forming the tinted thin film of the yellow color material on the LED chip by the CVD process.

Therefore, a white-light LED chip with uniformity in color that is capable of overcoming the above problems is desired.

BRIEF SUMMARY OF THE INVENTION

A white-light LED chip and a fabrication method thereof are provided. The white-light LED chip does not require a package for white light emission. An exemplary embodiment of the white-light LED chip comprises a blue-light LED chip having a top surface and a bottom surface. A phosphor layer is disposed on the top surface of the blue-light LED chip, wherein the phosphor layer is directly in contact with the top surface of the blue-light LED chip.

An exemplary embodiment of the method for fabricating the white-light LED chip comprises providing a plurality of blue-light LED chips, having a top surface and a bottom surface, wherein each blue-light LED chip has at least one contact pad on the top surface of the blue-light LED chip. The bottom surfaces of the blue-light LED chips are attached on a substrate. A protective layer is formed on the contact pads, exposing the top surface of the blue-light LED chips. A phosphor material is formed on the top surface of the blue-light LED chips. A mold is provided on the phosphor material to form a phosphor layer on the top surface of the blue-light LED chips except for the area of the contact pad on the top surface of the blue-light LED chip. Then, the protective layer is removed from the contact pads, and the substrate is divided between the adjacent blue-light LED chips to form a plurality of white-light LED chips.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
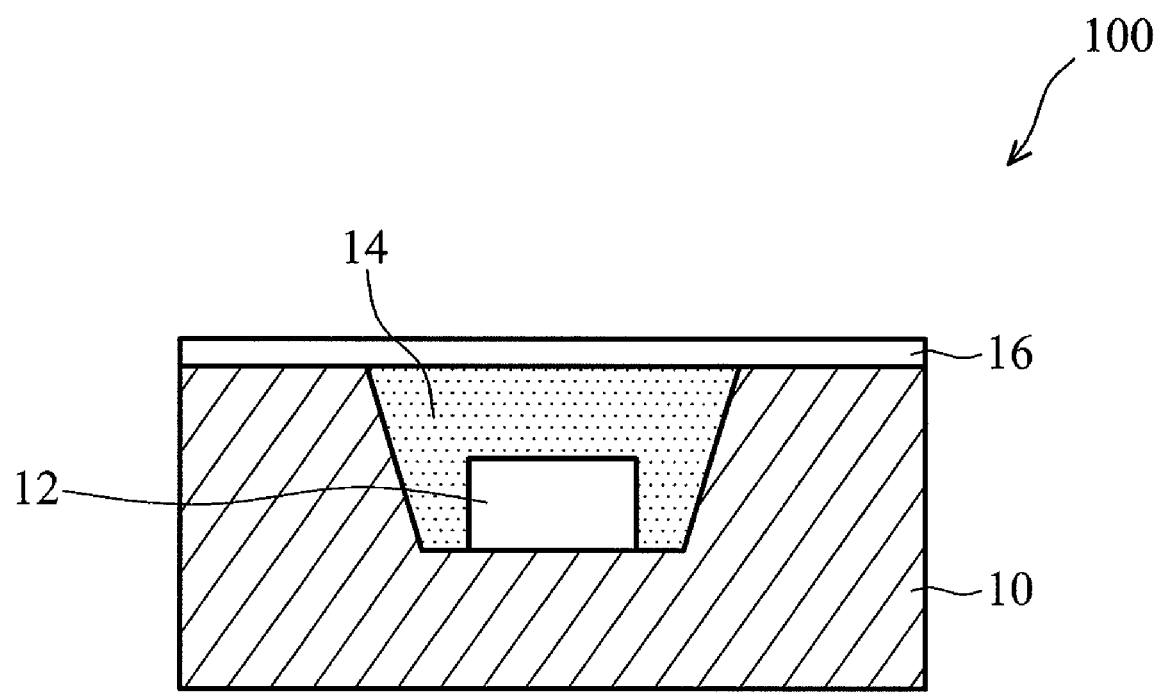
FIG. 1 is a schematic cross section of a conventional white light emitting device.
Figure 2:
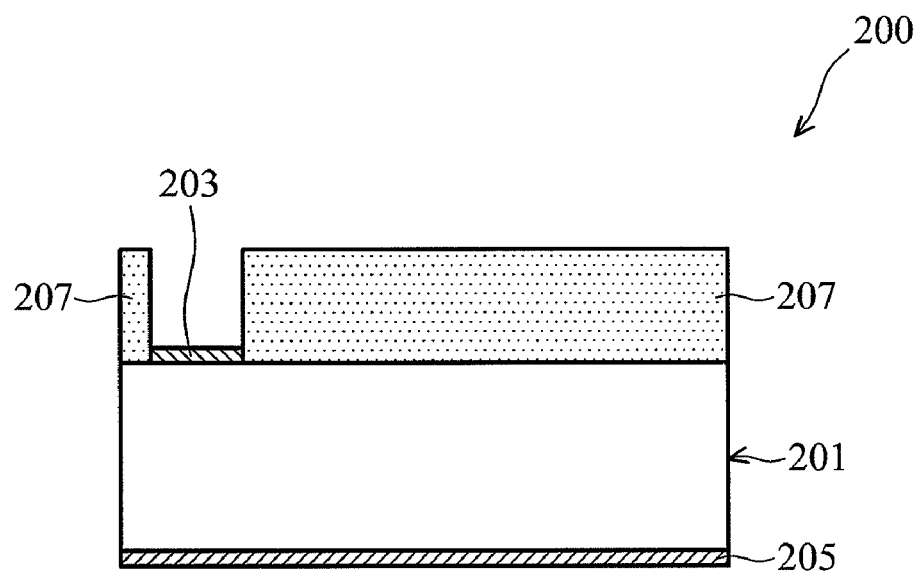
FIG. 2 is a schematic cross section of a white-light LED chip according to one embodiment of the invention.
Figure 3:
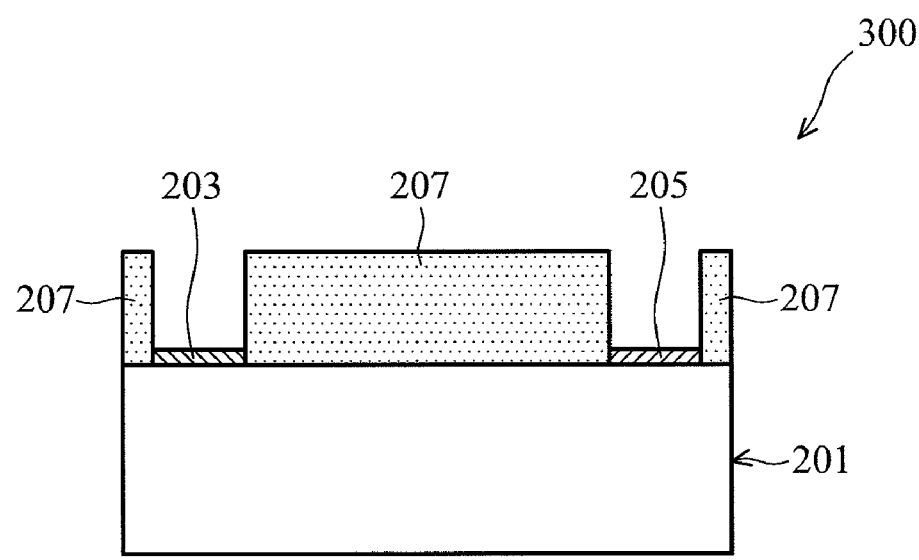
FIG. 3 is a schematic cross section of a white-light LED chip according to another embodiment of the invention.

The invention provides white-light LED chips that do not require a package for white light emissions. FIGS. 2 and 3 show cross sections of exemplary embodiments of a white-light LED chip according to the invention. Referring to FIG. 2, the white-light LED chip 200 comprises a blue-light LED chip 201 and a phosphor layer 207 disposed on a top surface of the blue-light LED chip 201. In this embodiment, the blue-light LED chip 201 is a vertical LED chip which has an n-contact pad 203 disposed on the top surface of the LED chip 201 and a p-contact pad 205 disposed on a bottom surface of the LED chip 201. The top surface of the blue-light LED chip 201 is the light emitting surface and the bottom surface thereof is the opposite surface to the top surface. The top surface of the blue-light LED chip 201 is directly covered with the phosphor layer 207 except for the area of the n-contact pad 203.

Referring to FIG. 3, another embodiment of a white-light LED chip 300 according to the invention is shown. The white-light LED chip 300 comprises a blue-light LED chip 201 and a phosphor layer 207 disposed on a top surface of the blue-light LED chip 201. In this embodiment, the blue-light LED chip 201 is a lateral LED chip which has an n-contact pad 203 and a p-contact pad 205 disposed on the top surface of the LED chip 201. The top surface of the blue-light LED chip 201 is directly covered with the phosphor layer 207 except for the area of the n-contact pad 203 and the p-contact pad 205.

In general, the blue-light LED chip 201 includes an n-type region, an active region and a p-type region, wherein the active region is disposed between the n-type region and the p-type region. The n-contact pad 203 is associated with the n-type region and the p-contact pad 205 is associated with the p-type region. In order to simplify the diagram, the variety of regions in the blue-light LED chip 201 is not depicted. In some embodiments, the active region can be comprised of Gallium-Nitride (GaN) and Indium to produce InGaN/GaN semiconductor layers. The n-type region can be an n-GaN layer and a p-type region can be a p-GaN layer. Electrical power is applied to the n-contact pad 203 and p-contact pad 205 which cause the LED chip 201 to emit blue light. The phosphor layer 207 contains luminescent materials which can convert a portion of the blue light emitted by the LED chip 201 into yellow light. The luminescent materials of the phosphor layer 207 may be ZnSe, CeO, $Al_2O_3$, and $Y_2O_3$: Ce. Thus, the yellow light of the phosphor layer 207 is combined with the blue light emitted by the LED chip 201 to form a white light.

Figure 4A:
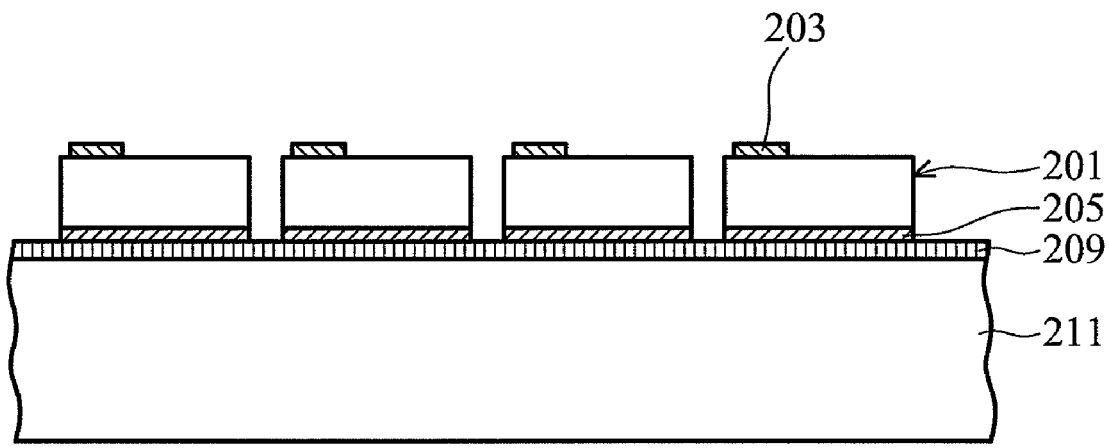
FIGS. 4A to 4F are cross sections of an exemplary embodiment of a method for fabricating the white-light LED chip of FIG. 2 according to the invention.

Referring to FIGS. 4A to 4F, which are cross sections of an exemplary embodiment of a method for fabricating the white-light LED chip of FIG. 2 according to the invention. As shown in FIG. 4A, a plurality of blue-light LED chips 201 are provided to be disposed adjacent to each other on a temporary substrate 211. The temporary substrate 211 may be a silicon wafer or other semiconductor wafers, which is removed after the white-light LED chip is completed. In one embodiment, an adhesive layer 209 such as epoxy resin is formed on the substrate 211. The bottom surface of the blue-light LED chip 201 is attached to the substrate 211 through the adhesive layer 209. In this embodiment, the p-contact pad 205 of the blue-light LED chips 201 is attached to the substrate 211.

Figure 4B:
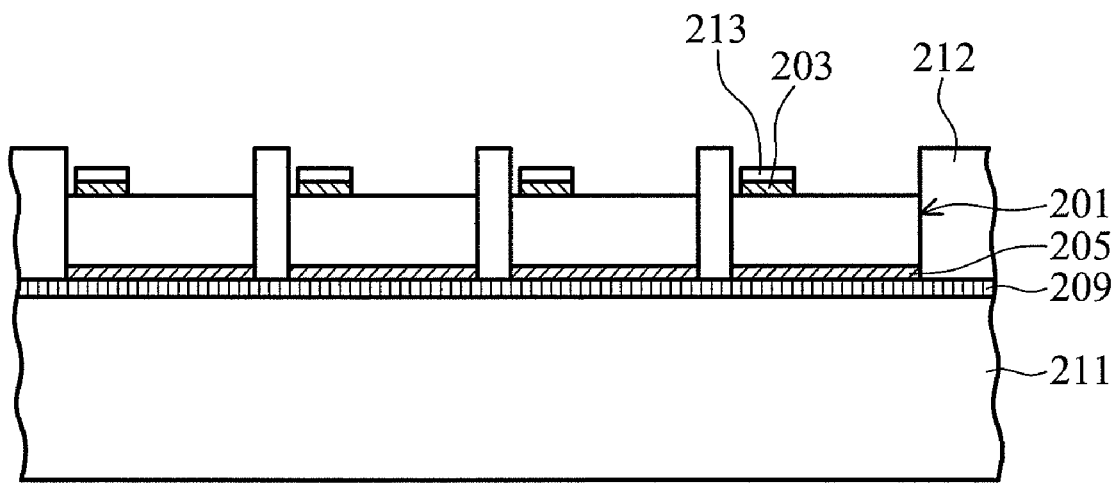
Figure 4C:
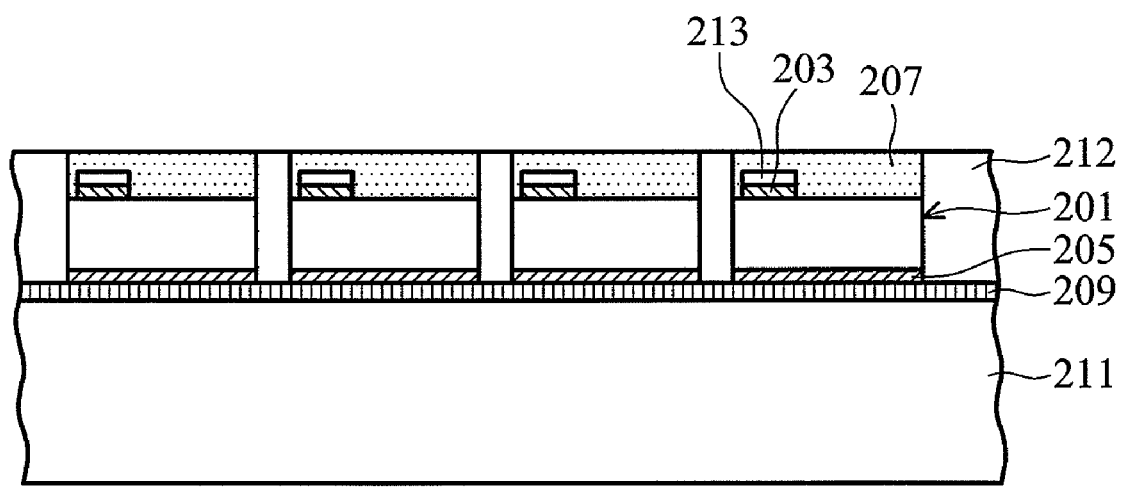

Referring to FIG. 4B, a protective layer 213 is formed on the n-contact pads 203 of the blue-light LED chips 20, exposing the other top surfaces of the blue-light LED chips 201. The protective layer 213 may be a photoresist which is patterned by a photolithography process to form the protective layer 213 on the n-contact pads 203. The protective layer 213 can also be a hard mask which has a pattern corresponding to the n-contact pads 203. In addition, a photoresist or a hard mask 212 is disposed on the temporary substrate 211 and between the blue-light LED chips 201. The materials of the photoresist or the hard mask 212 may be the same as the protective layer 213, and the photoresist or the hard mask 212 can be formed together with the protective layer 213. Then, referring to FIG. 4C, a phosphor material 207 is formed on the top surface of the blue-light LED chips 201 by a spray coating, a dispensing process or other coating processes. The phosphor material 207 is such as ZnSe, CeO, $Al_2O_3$, and $Y_2O_3$: Ce which can convert a portion of the blue light emitted by the LED chip 201 into a yellow light.

Figure 4D:
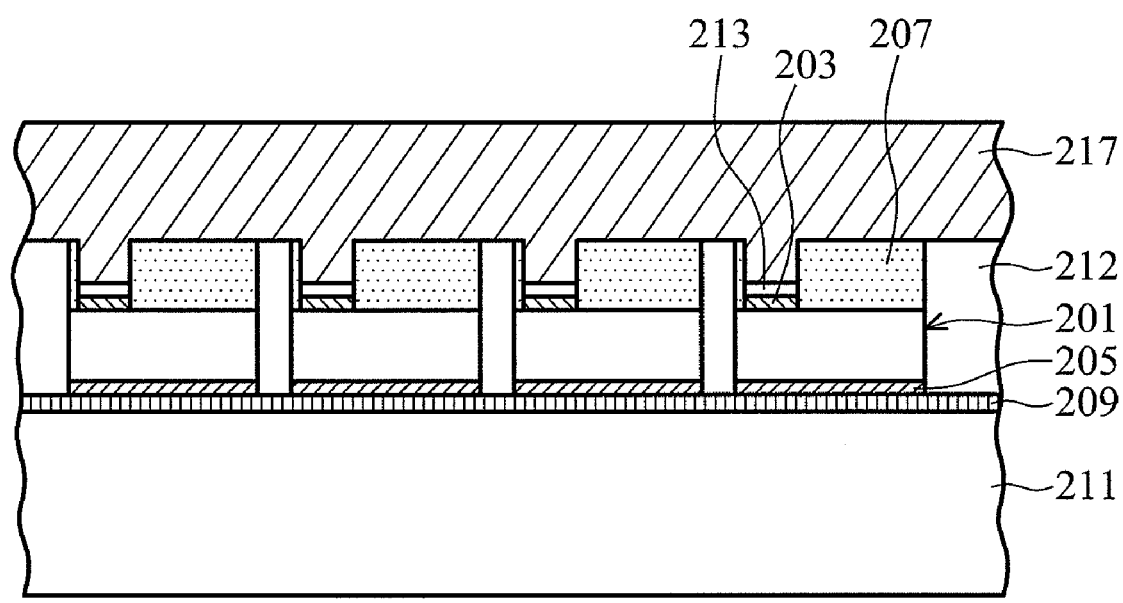
Figure 4E:
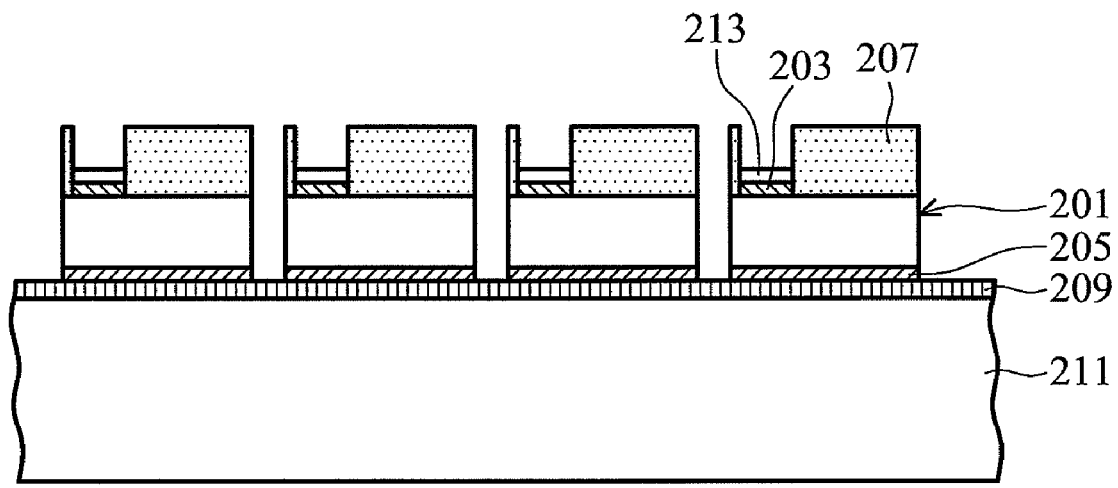

Referring to FIG. 4D, a mold 217 is provided to mold the phosphor material 207 into a phosphor layer. As a result of the molding process, the phosphor layer 207 is formed on the top surface of the blue-light LED chip 201 except for the area of the n-contact pad 203. Meanwhile, the n-contact pad 203 is protected by the protective layer 213. Then, as shown in FIG. 4E, the mold 217 is removed after the phosphor layer 207 is formed. In addition, the photoresist or the hard mask 212 is also removed from the temporary substrate 211. The photoresist 212 can be removed by a development process. The hard mask 212 can be removed by a stripping process. After the photoresist or the hard mask 212 is removed, only the top surface of the blue-light LED chip 201 is covered with the phosphor layer 207 and the sidewalls of the blue-light LED chip 201 are not covered with the phosphor layer 207.

Figure 4F:
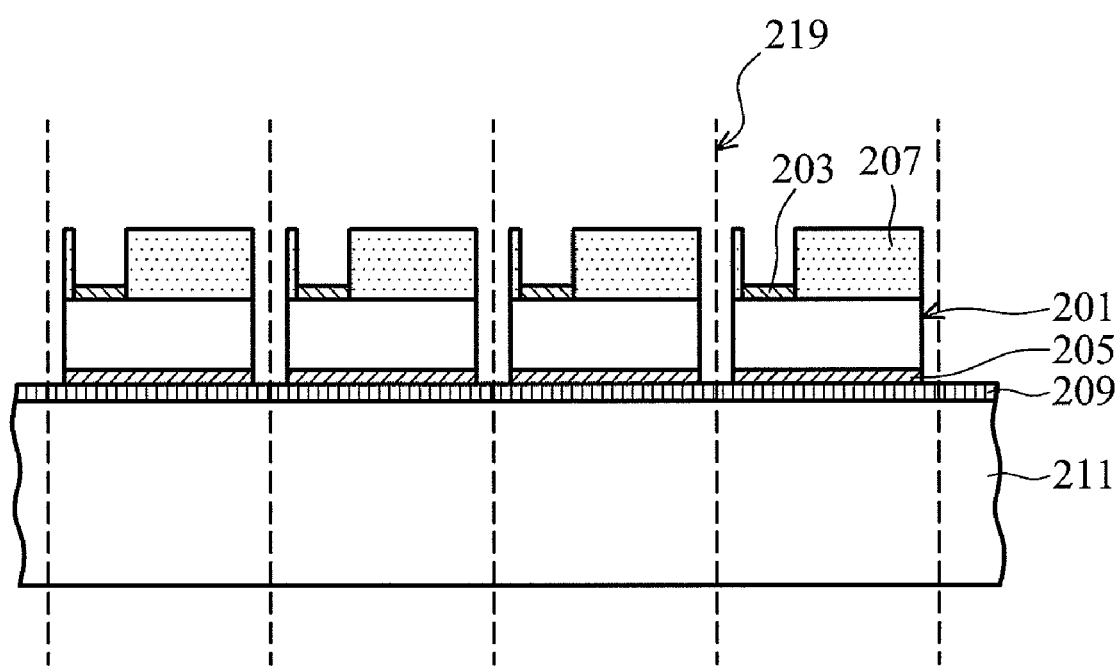

Referring to FIG. 4F, the protective layer 213 is removed from the n-contact pad 203. In one embodiment, the protective layer 213 may be a photoresist which can be removed by a development process. In another embodiment, the protective layer 213 may be a hard mask which can be directly removed by a stripping process. After removing the protective layer 213, the substrate 211 is divided along a scribe line 219 between the adjacent blue-light LED chips 201. Then, the bottom surface of the blue-light LED chip 201 is separated from the temporary substrate 211 to form the white-light LED chip 200 as shown in FIG. 2.

In another embodiment, the method for fabricating the white-light LED chip 300 of FIG. 3 according to the invention is the same as the embodiment of FIGS. 4A to 4F, except that the n-contact pad 203 and the p-contact pad 205 are both disposed on the top surface of the blue-light LED chip 201. Meanwhile, in the process for fabricating the white-light LED chip 300, the n-contact pad 203 and the p-contact pad 205 are both covered with the protective layer 213. In addition, a mold used for the white-light LED chip 300 is different from the mold 217 used in the white-light LED chip 200. As a result of a molding process for the white-light LED chip 300, the phosphor layer 207 is formed on the top surface of the blue-light LED chip 201 to expose the n-contact pad 203 and the p-contact pad 205.

Although in the embodiment of the vertical white-light LED chip 200, the n-contact pad 203 is disposed on the top surface of the blue-light LED chip 201 and the p-contact pad 205 is disposed on the bottom surface of the blue-light LED chip 201. In other embodiments of the invention, the vertical white-light LED chip can also have an n-contact pad on the bottom surface of the LED chip and a p-contact pad on the top surface of the LED chip.

The white-light LED chips 200 and 300 according to the embodiments of the invention can be used to emit white light without packaging. The white-light LED chips 200 and 300 can also be a part of another assembly such as displays or illuminative devices which provide white light emissions.

According to the aforementioned embodiments, the white-light LED chips of the invention can provide white light emissions without packaging the blue-light LED chips. The phosphor layer is directly disposed on the top surface of the blue-light LED chip and can convert a portion of blue light emitted by the blue-light LED chip into yellow light. Therefore, the yellow light from the phosphor layer is combined with the blue light from the blue-light LED chip to form a white light. Accordingly, the white-light LED chips of the invention do not need packages. Moreover, the white-light LED chips according to the embodiments of the invention can produce uniform white light due to uniform thickness of the phosphor layer on the blue-light LED chip.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A white-light light emitting diode (LED) chip, comprising:
   a blue-light LED chip, having a top surface and a bottom surface;
   a phosphor layer disposed on the top surface of the blue-light LED chip, wherein the phosphor layer is directly in contact with the top surface of the blue-light LED chip; and
   an n-contact pad disposed on the top surface of the blue-light LED chip and a p-contact pad disposed on the bottom surface of the blue-light LED chip.

2. The white-light LED chip as claimed in claim 1, wherein the n-contact pad is not covered with the phosphor layer.

3. The white-light LED chip as claimed in claim 1, wherein a sidewall of the white-light LED chip is not covered with the phosphor layer.

4. The white-light LED chip as claimed in claim 1, wherein the phosphor layer comprises a yellow phosphor material, and the yellow phosphor material interacts with blue light of the blue-light LED chip to form a white light.

5. A method for fabricating a white-light LED chip, comprising:
   providing a plurality of blue-light LED chips, having a top surface and a bottom surface, wherein each blue-light LED chip has at least one contact pad on the top surface of the blue-light LED chip;
   attaching the bottom surfaces of the blue-light LED chips on a substrate;
   forming a protective layer on the contact pads of the top surfaces of the blue-light LED chips;
   forming a phosphor material on the top surfaces of the blue-light LED chips;
   providing a mold on the phosphor material to form a phosphor layer on the top surfaces of the blue-light LED chips;
   removing the protective layer from the contact pads; and
   dividing the substrate between the adjacent blue-light LED chips to form a plurality of white-light LED chips.

6. The method as claimed in claim 5, wherein each blue-light LED chip has an n-contact pad on the top surface of the blue-light LED chip and a p-contact pad on the bottom surface of the blue-light LED chip.

7. The method as claimed in claim 6, wherein the protective layer is formed on the n-contact pad.

8. The method as claimed in claim 5, wherein each blue-light LED chip has an n-contact pad and a p-contact pad on the top surface of the blue-light LED chip.

9. The method as claimed in claim 8, wherein the protective layer is formed on the n-contact pad and the p-contact pad.

10. The method as claimed in claim 5, wherein the protective layer comprises a photoresist or a hard mask.

11. The method as claimed in claim 5, wherein the step of forming the phosphor material comprise a spray coating or a dispensing process.

12. The method as claimed in claim 5, wherein the contact pads on the top surfaces of the blue-light LED chips are not covered with the phosphor layer.

13. The method as claimed in claim 5, wherein a sidewall of the white-light LED chip is not covered with the phosphor layer.

14. The method as claimed in claim 5, wherein the phosphor layer interacts with blue light of the blue-light LED chip to form a white light.

15. The method as claimed in claim 5, wherein the step of attaching the blue-light LED chips on the substrate further comprises forming an adhesive layer between the blue-light LED chips and the substrate.

16. The method as claimed in claim 5, after the step of dividing the substrate, further comprising separating the white-light LED chip from the substrate.

17. The method as claimed in claim 5, wherein the substrate comprises a semiconductor wafer.

* * * * *